United States Patent
Fidanza et al.

(10) Patent No.: US 7,645,934 B1
(45) Date of Patent: Jan. 12, 2010

(54) NANOSTRUCTURED LAYER AND FABRICATION METHODS

(75) Inventors: Jacqueline Fidanza, San Francisco, CA (US); Brian M. Sager, Palo Alto, CA (US); Martin R. Roscheisen, San Francisco, CA (US); Dong Yu, Fremont, CA (US); Gina J. Gerritzen, San Jose, CA (US)

(73) Assignee: Nanosolar, Inc., San Jose, CA (US)

( * ) Notice: Subject to any disclaimer, the term of this patent is extended or adjusted under 35 U.S.C. 154(b) by 504 days.

(21) Appl. No.: 10/427,749

(22) Filed: Apr. 29, 2003

(51) Int. Cl.
*H01L 31/00* (2006.01)
*B29C 65/00* (2006.01)
*B32B 3/26* (2006.01)

(52) U.S. Cl. .................... 136/263; 264/44; 428/304.4

(58) Field of Classification Search ................. 136/263; 264/44; 428/304.4–308
See application file for complete search history.

(56) References Cited

U.S. PATENT DOCUMENTS

| | | | |
|---|---|---|---|
| 5,482,570 A | 1/1996 | Saurer et al. ............... 136/255 |
| 5,525,440 A | 6/1996 | Kay et al. ................... 429/111 |
| 5,571,612 A | 11/1996 | Motohiro et al. ............ 428/323 |
| 5,747,180 A * | 5/1998 | Miller et al. ................ 428/601 |
| 6,270,846 B1 | 8/2001 | Brinker et al. ............ 427/385.5 |
| 6,278,056 B1 | 8/2001 | Sugihara et al. ............ 136/263 |
| 6,291,763 B1 | 9/2001 | Nakamura ................. 136/256 |
| 6,340,789 B1 | 1/2002 | Petritsch et al. ............ 136/263 |
| 6,649,824 B1 * | 11/2003 | Den et al. .................. 136/256 |
| 2002/0017656 A1 | 2/2002 | Graetzel et al. ............. 257/184 |
| 2002/0134426 A1 | 9/2002 | Chiba et al. ................ 136/263 |
| 2002/0192441 A1 | 12/2002 | Kalkan et al. .............. 428/209 |
| 2003/0226498 A1 | 12/2003 | Alivisatos et al. ............ 117/84 |
| 2004/0084080 A1 | 5/2004 | Sager et al. ................ 136/263 |
| 2004/0118448 A1 | 6/2004 | Scher et al. ................ 136/252 |
| 2004/0146560 A1 | 7/2004 | Whiteford et al. ........... 424/484 |

(Continued)

FOREIGN PATENT DOCUMENTS

DE 2741954 3/1979

(Continued)

OTHER PUBLICATIONS

Coakley, K. M., Liu, Y., McGehee, M. D., Frindell, K. L., and Stucky, G. D., Infiltrating Semiconducting Polymers into Self-Assembled Mesoporous Titania Films for Photovoltaic Applications, Advanced Functional Materials, vol. 13, No. 4, Published online Apr. 11, 2003, pp. 301-306.*

(Continued)

*Primary Examiner*—Jeffrey T. Barton

(57) ABSTRACT

Nanostructured layers with 10 nm to 50 nm pores spaced 10-50 nm apart, a method for making such nanostructured layers, optoelectronic devices having such nanostructured layers and uses for such nanostructured layers are disclosed. The nanostructured layer can be formed using precursor sol, which generally includes one or more covalent metal complexes, one or more surfactants, a solvent, one or more optional condensation inhibitors, and (optionally) water. Evaporating the solvent from the precursor sol forms a surfactant-templated film. Covalently crosslinking the surfactant-templated film forms a nanostructured porous layer. Pore size is controlled, e.g., by appropriate solvent concentration, choice of surfactant, use of chelating agents, use of swelling agents or combinations of these.

26 Claims, 4 Drawing Sheets

U.S. PATENT DOCUMENTS

2004/0178390 A1    9/2004    Whiteford et al. ........... 252/500

FOREIGN PATENT DOCUMENTS

| EP | 1028475 A1 | 8/2000 |
|---|---|---|
| EP | 1087446 A2 | 3/2001 |
| WO | WO 02/084708 | 10/2002 |

OTHER PUBLICATIONS

Yang, P., Zhao, D., Margolese, D. I., Chmelka, B. F., and Stucky, G. D., Block Copolymer Templating Syntheses of Mesoporous Metal Oxides with Large Ordering Lengths and Semicrystalline Framework, Chem. Mater., vol. 11, 1999, pp. 2813-2826.*

Hagfeldt, A., and Gratzel, M., Molecular Photovoltaics, Accounts of Chemical Research, vol. 33, No. 5, 2000, pp. 269-277.*

Scott, B. J., Wimsberger, G., and Stucky, G. D., Mesoporous and Mesostructured Material for Optical Applications, Chem. Mater., vol. 13, 2001, pp. 3140-3150.*

Schmidt-Winkel, P. et al., "Mesocellular Siliceous Foams with Uniformly Sized Cells and Windows". J. Am. Chem. Soc. 121, 254-255. (1999).*

M. Granstrom, K. Petritsch, A. C. Arias, A. Lux, M. R. Andersson & R. H. Friend. 1998. Laminated fabrication of polymeric photovoltaic diodes. Nature 395, 257-260.

Gebeyehu, D., Brabec, C.J., Saricifti, N.S., Vangeneugden, D., Kiebooms, R., Vanderzande, D., Kienberger, F., and H. Schnindler. 2002. Hybrid Solar Cells based on dye-sensitized nanoporous TiO2 electrods and conjugated polymers as hole transport materials. Synthetic Metals 123, 279-287.

Greg P. Smestad, Stefan Spiekermann, Janusz Kowalik, Christian D. Grant, Adam M. Schwartzberg, Jin Zhang, Laren M. Tolbert, and Ellen Moons. 2002. A technique to compare polythiophene solid-state dye sensitized TiO2 solar cells to liquid junction devices.Solar Energy Materials & Solar Cells, in press.

Hongyou Fan, Yunfeng Lu, Aaron Stump, Scott T. Reed, Tom Baer, Randy Schunk, Victor Perez-Luna, Gabriel P. Lopez & C. Jeffrey Brinker. 2000. Rapid prototyping of patterned functional nanostructures, Nature 405, 56-60.

Alan Sellinger, Pilar M.Weiss, Anh Nguyen, Yunfeng Lu, Roger A. Assink, Weiliang Gong & C. Jeffrey Brinker. 1998. Continuous self-assembly of organic—inorganic nanocomposite coatings that mimic nacre. Nature 394, 256-260.

Yunfeng Lu, Rahul Ganguli, Celeste A. Drewien, Mark T. Anderson, C. Jeffrey Brinker, Weilang Gong, Yongxing Guo, Hermes Soyez, Bruce Dunn, Michael H. Huang & Jeffrey I. Zink. 1997. "Continuous formation of supported cubic and hexagonal mesoporous films by sol—gel dip-coating," Nature 389, Sep. 25, 1997.

L. Schmidt-Mende, A. Fechtenkotter, K. Mullen, E. Moons,R. H. Friend, J. D. MacKenzie. 2002. Self-Organized Discotic Liquid Crystals for High-Efficiency Organic Photovoltaics. Science 293, 1119-1122.

Wendy U. Huynh, Janke J. Dittmer, A. Paul Alivisatos. 2002. Hybrid Nanorod-PolymerSolar Cells. Science 295, 2425- 2427.

Thuc-Quyen Nguyen, Junjun Wu, Vinh Doan, Benjamin J. Schwartz, Sarah H. Tolbert. 2000. Control of Energy Transfer in Oriented Conjugated Polymer—Mesoporous Silica Composites. Science 288, 652-656.

Heeger, A.J. 2000. Semiconducting and metallic polymers: the fourth and fifth generation of polymeric materials. Synthetic Metals 125, 23-42.

Michael H. Huang, Amer Choudrey and Peidong Yang, "Ag Nanowire Formation within Mesoporous Silica" Chem. Commun., 2000, 1063-1064.

Andrew A. Gewirth, Panos C. Andricacos, and Jay A. Switzer, with John O. Dukovic, editor "Hot Topics in Electrodeposition", The Electrochemical Society Interface • Spring 1998.

Huang Y, Duan, X, Wei, Q, & C.M. Lieber, "Directed Assembly Of One-Dimensional Nanostructures Into Functional Networks" Science 291(5504):630-633 (2001).

Byung Hee Hong, Sung Chul Bae, Chi-Wan Lee, Sukmin Jeong, and Kwang S. Kim, "Ultrathin Single-Crystalline Silver Nanowire Arrays Formed in an Ambient Solution Phase", Science 294: 348-351; Published online Sep. 6, 2001.

Justin D. Holmes, Keith P. Johnston, R. Christopher Doty, and Brian A. Korgel, "Control of Thickness and Orientation of Solution-Grown Silicon Nanowires" Science Feb. 25, 2000; 287: 1471-1473.

Lu, Y., Yang, Y., Sellinger, A., Lu, M., Huang, J., Fan, H., Haddad, R., Lopez, G., Burns, A.R., Sasaki, D.Y., Shelnutt, J., and C. J. Brinker, "Self-Assembly of Mesoscopically Ordered Chromatic Polydiacetylene Nanocomposites", Nature 410: 913-917 (2001.) .

Halls et al., "Efficient Photodiodes from interpenetrating Polymer Networks", Nature, vol. 376 Aug. 10, 1995.

O'Regan et al. "A Low-cost, High-efficiency solar cell based on dye-sensitized colloidal $TiO_2$ Films", Nature, vol. 353 pp. 737-740, Oct. 24, 1991.

Mapes et al., "Ionic Conductivities of Poly(siloxane) Polymer Electrolytes with Varying Length of Linear Ethoxy Sidechains, Different Molecular Weights, and Mixed Copolymers", Polymer Preprints, 41(1), pp. 309-310 (2000).

Hooper et al., "A Highly Conductive Solid-State Polymer Electrolyte Based on a Double-Comb Polysiloxane Polymer with Oligo(ethylene oxide) Side Chains", Organometallics, vol. 18, No. 17, Aug. 16, 1999.

U.S. Appl. No. 10/290,119, to Brian M. Sager et al., filed Nov. 5, 2002 and entitled "Optoelectronic Device and Fabrication Methods".

U.S. Appl. No. 10/303,665 to Martin R. Roscheisen et al. entitled "Molding Technique for Fabrication of Optoelectronic Devices" and filed on Nov. 22, 2002.

U.S. Appl. No. 10/319,406 to Brian M. Sager et al., filed on Dec. 11, 2002 and entitled "NANO-Architected/Assembled Solar Electricity Cell".

U.S. Appl. No. 10/426,242 to Brian M. Sager et al, filed Apr. 28, 2003 and entitled "Combinatorial Fabrication and High-Throughput Screening of Optoelectronic Devices,".

Heini Saloniemi, "Electrodeposition of Pbs, PbSe and PbTe Thin Films" by Heini Saloniemi, VTT Publications 423, Dec. 15, 2000, an electronic copy of which may be accessed at http://www.inf.vtt.fi/pdf/publications/2000/P423.pdf.

Merriam Webster Online Dictionary entry for "substantial" [online], [retrieved on Sep. 15, 2004]. Retrieved from the Internet ,<URL: http://www.m-w.com/cgi-bin/dictionary?book=Dictionary &va=substantially>.

Merriam Webster Online Dictionary entry for "template" [online], [retrieved on Jul. 16, 2004]. Retrieved from the Internet, <URL: http://www.m-w.com/cgi-bin/dictionary?book=Dictionary &va=template>.

Merriam Webster Online Dictionary entry for "include" [online], [retrieved on Jun. 14, 2004]. Retrieved from the Internet ,<URL: http://www.m-w.com/cgi-bin/dictionary?book=Dictionary &va=include>.

D. Zhao et al. "Triblock Copolymer Syntheses of Mesoporous Silica with Periodic 50 to 300 Angstrom Pores" Science, 279, 548-552. (1998).

R. Ryoo et al. "Block-Copolymer-Templated Ordered Mesoporous Silica: Array of Uniform Mesopores or Mesopore-Micropore Network?" J. Phys. Chem. B. 104, 11465-11471. (2000).

M.H. Huang et al. "Catalytic Growth of Zinc Oxide Nanowires by Vapor Trasnport" Adv. Mater. 13, 113-116 (Jan. 2001).

* cited by examiner

200

- 202 — DISPOSE PRECURSOR SOL ON A SUBSTRATE, WHERE SOL INCLUDES ONE OR MORE COVALENT METAL COMPLEXES W/CENTRAL ELEMENT X, ONE OR MORE SURFACTANTS, AND A SOLVENT

- 204 — EVAPORATE SOLVENT FROM PRECURSOR SOL TO FORM SURFACTANT-TEMPLATED POROUS FILM

- 206 — CONTROL SIZE OF PORES FORMED IN SURFACTANT-TEMPLATED POROUS FILM SUCH THAT PORES HAVE DIAMETERS BTW ~10 nm AND ~50 nm W/ADJACENT PORES SPACED BETWEEN ~10 nm AND ~50 nm APART;

- 208 — COVALENTLY CROSSLINK SURFACTANT-TEMPLATED POROUS FILM TO FORM NANOSTRUCTURED POROUS LAYER BASED ON COMPOUND OF CENTRAL ELEMENT X AND HAVING PORES ~10 nm to ~50 nm IN DIAMETER SPACED ~10 nm TO ~50 nm APART

- 210 — (OPTIONAL) FILL PORES IN NANOSTRUCTURED POROUS LAYER W/SEMICONDUCTING OR CONDUCTING PORE-FILLING MATERIAL

FIG. 2

NANOSTRUCTURED LAYER AND FABRICATION METHODS

CROSS-REFERENCE TO AN EARLIER FILED APPLICATION

This application is related to U.S. patent application Ser. Nos. 10/290,119, 10/303,665 and 10/319,406, the entire disclosures of which are incorporated herein by reference.

FIELD OF THE INVENTION

This invention relates to nanostructured layers and more particularly to nanostructured porous layers.

BACKGROUND OF THE INVENTION

Porous materials find use in a wide variety of applications in the chemical, biomedical, electronic and optoelectronic arts. Desirable features of porous materials include pore size, regularity of pore distribution and ease of fabrication. Of particular interest are porous layers having regularly arrayed nanometer scale pores. Such layers, sometimes called nanostructured layers, can be fabricated in a number of ways. For example pores larger than about 50 nm can be made, e.g., using nanoparticle temptation. Smaller pores can be made in a variety of ways.

For example, commonly assigned co-pending U.S. patent application Ser. Nos. 10/290,119, 10/303,665 and 10/319,406 describe nanostructured porous layers made using a technique known as surfactant temptation. Nanostructured porous layers made using surfactant temptation can potentially have regularly arrayed nanometer-scale pores. Current surfactant temptation techniques have typically produced nanostructured porous layers with pores 2 nm-10 nm or larger than about 50 nm, which is often a major disadvantage.

Many applications can potentially benefit from the use of 10-50 nm pores. For example, charge-splitting networks can be made by filling the pores in a nanostructured porous layer made, e.g., of Titania ($TiO_2$), with organic materials such as dyes, pigments and conjugated polymers. Unfortunately, some of these pore-filling materials are relatively large molecules that may not completely fill pores smaller than about 20 nm in diameter.

Pores larger than about 50 nm in diameter tend to make the charge-splitting network less efficient. Applications other than optoelectronics can also benefit from 10-50 nm pores. Unfortunately, there is no known technique for making a porous layer with regularly arrayed pores in 10 nm to 50 nm size range.

Thus, there is a need in the art for an improved nanostructured layer with pores between about 10 nm and about 50 nm in diameter and a corresponding method of making such a nanostructured layer.

SUMMARY OF THE INVENTION

The disadvantages associated with the prior art are overcome by embodiments of the present invention directed to a method for making an nanostructured layer, devices having such a nanostructured layer and uses for such nanostructured layers. In the method a precursor sol is disposed on a substrate. The precursor sol generally includes one or more covalent metal complexes with a central element X, one or more surfactants, and one or more solvents. The precursor sol may optionally include one or more condensation inhibitors and/or water. The solvent is evaporated from the precursor sol to form a surfactant-templated film. The size of one or more pores formed in the surfactant-templated film is controlled such that the pores have diameters between about 10 nm and about 50 nm with adjacent pores spaced between about 10 nm and about 50 nm. The size of the pores may be controlled, e.g., by appropriate concentration of the solvent, the choice of surfactant, use of a chelating agent, and/or a swelling agent. The surfactant-templated film is covalently crosslinked to form a nanostructured porous layer based on a compound of central element X. As a result of control of the pore size in the surfactant templated porous film, the nanostructured porous layer has pores with diameters between about 10 nm and about 50 nm with adjacent pores spaced between about 10 nm and about 50 nm. The pores in the nanostructured porous layer may be subsequently filled with a pore-filling material having complementary transfer properties with respect to the compound of central element X.

Embodiments of optoelectronic devices include an active layer made as set forth above disposed between two electrodes. At least one of the two electrodes is a transparent conducting electrode.

The use of an active layer made according to above method in an optoelectronic device allows for highly efficient PV devices, such as solar cells, at relatively low cost.

BRIEF DESCRIPTION OF THE DRAWINGS

FIG. 2 is flow diagram illustrating methods of forming a nanostructured layer according to embodiments of the present invention.

DETAILED DESCRIPTION OF THE INVENTION

Contents

I. Glossary

II. Nanostructured Layer

III. Nanostructured Layer Fabrication

IV. Examples of Nanostructured Layer Fabrication

V. Optoelectronic Devices Using Nanostructured layer

VI. Alternative Embodiments

VII. Conclusion

I. GLOSSARY

Figure 1:
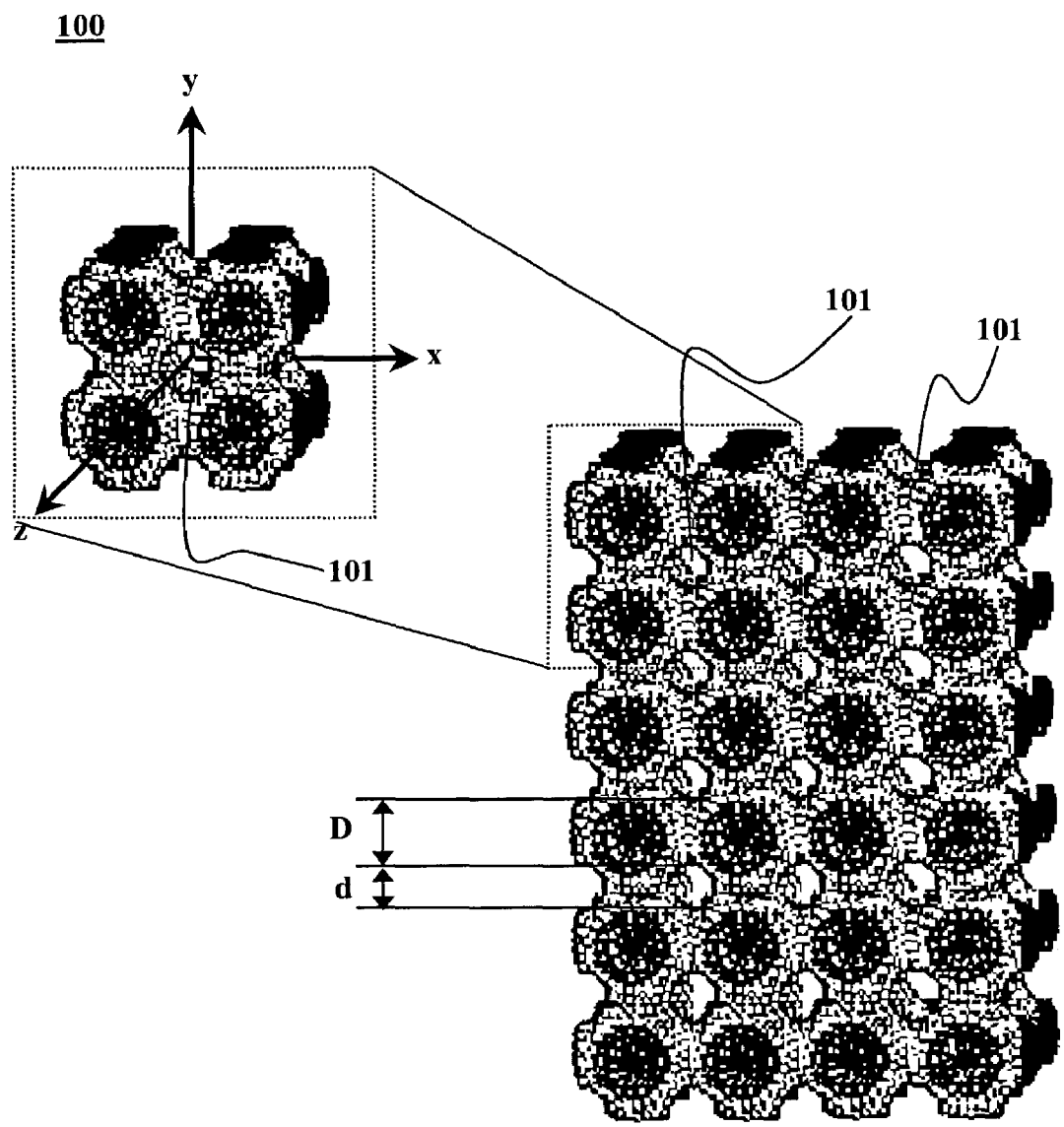
FIG. 1 depicts an isometric close-up view of a portion of a possible structure for a nanostructured layer according to an embodiment of the present invention.

The following terms are intended to have the following general meanings as they are used herein:

The article "A", or "An" refers to a quantity of one or more of the item following the article, except where expressly stated otherwise, e.g., "a single" layer.

Active Layer generally refers to the layer within an optoelectronic or solar cell device where conversion of radiant energy to electrical energy, or vice versa, takes place.

Complementary charge-transfer properties: As used herein, a first and second material are said to have complementary charge-transfer properties with respect to each other when the first material is a hole-acceptor and/or hole-transporter with respect to the second and the second is an electron-acceptor and/or electron-transporter with respect to the first or vice versa. Two materials can have complementary charge-transfer properties if they have different electron affinities.

Device: An assembly or sub-assembly having one or more layers of material.

Hole-Acceptor, Electron-Acceptor: In the case of charge-accepting/transporting materials, hole-acceptor and electron-acceptor are relative terms for describing charge transfer between two materials. For two materials wherein a first material has a valence band edge or highest occupied molecular orbital (HOMO) that is higher than the corresponding valence band edge or HOMO for a second material, and wherein the first material has a conduction band edge or lowest unoccupied molecular orbital (LUMO) that is higher than the corresponding conduction band edge or LUMO for the second material, the first material is a hole-acceptor with respect to the second material and the second material is an electron-acceptor with respect to the first material. A particular band edge or molecular orbital is said to be "higher" when it is closer the vacuum level.

Includes, including, e.g., "such as", "for example", etc., "and the like" may, can, could and other similar qualifiers used in conjunction with an item or list of items in a particular category means that the category contains the item or items listed but is not limited to those items.

Inorganic Materials Materials that do not contain carbon as a principal element. The oxides and sulfides of carbon and the metallic carbides are considered inorganic materials.

Layer refers to a feature characterized by a substantially greater length and/or width compared to its thickness. A layer may be composed of multiple structures in a substantially two-dimensional array or two or more sub-layers stacked on top of one another or some combination of both.

Nanostructured Layer: generally refers to a film of material having features characterized by a width, or other characteristic dimension, on the order of several nanometers ($10^{-9}$ m) across.

Optoelectronic Device: A device that interacts with radiation and electric current. Such a device could be a radiation-emitting device, e.g. a light-emitting diode (LED) or laser, or a radiation absorbing device, e.g. a photodetector/counter, photovoltaic cell (solar cell) or radiation-driven electrolysis cell.

Organic Materials Compounds, which principally consist of carbon and hydrogen, with or without oxygen, nitrogen or other elements, except those in which carbon does not play a critical role (e.g., carbonate salts). Examples of organic materials include:

(a) Organic Dyes and pigments such as perylenes, phthalocyanines, merocyanines, terylenes and squaraines and their derivatives.

(b) Polymers: Materials consisting of large macromolecules composed of more than one repeating units. Polymers, composed of 2-8 repeating units are often referred to as oligomers. Examples of such repeating units include, e.g., dyes or pigments.

Photovoltaic Device: A type of optoelectronic device that absorbs radiation coverts energy from the radiation into electrical energy.

Pore Spacing refers to the distance between neighboring pores measured, e.g., from pore edge to pore edge or by pore wall thickness.

Radiation: Energy which may be selectively applied including electromagnetic energy having a wavelength between 10-14 and $10^4$ meters including, for example, gamma radiation, x-rays, ultraviolet light, visible light, infrared light, microwaves and radio waves.

Semiconductor: As used herein, semiconductor generally refers to a material characterized by an electronic bandgap typically between about 0.5 eV and about 3.5 eV.

Surfactant Templation: As used herein, surfactant temptation refers an approach toward achieving pore size control of inorganic or organic frameworks, e.g., by using surfactants or block copolymers as templates to build a structured mineral network. Surfactant temptation includes the sol-gel approach described below.

Solar Cell refers to a photovoltaic device that interacts with radiation (often in the form of sunlight) impinging on the device to produce electric power/voltage/current.

II. NANOSTRUCTURED LAYER

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

FIG. 1 depicts a simplified and somewhat idealized diagram of a desirable morphology for a nanostructured porous layer 100 that may be used in embodiments of the present invention. The nanostructured porous layer has numerous pores 101 that are interconnected with each other. The pores may run along x, y and z directions and intersect with each other as shown in the inset in FIG. 1. The pores 101 may be characterized by a diameter d. The nanostructured porous layer 100 may be characterized by a spacing D between neighboring pores 101, measured e.g., from edge-to-edge. The pore diameter d and pore spacing D are substantially uniform across the nanostructured porous layer 100. The pores 101 provide continuous paths between opposite surfaces of the nanostructured porous layer 100. The path through the pores 101 provides access to the pores from a layer overlying or a layer underlying the nanostructured porous layer 100.

When used in an active layer, the nanostructured porous layer 100 may be made from an inorganic compound (e.g., a metal, an oxide, nitride, oxynitride, etc.) based on a central element X. The central element X may be a metal, particularly a transition metal. The central element X may be a transition metal, e.g., Ag, Au, Cd, Co, Cr, Cu, Fe, Ir, Mn, Mo, Nb, Ni, Sr, Ta, Ti, V, W, Y, Zn, Zr, etc. Other suitable central elements X include Al, B, Ba, Ce, Ge, Hf. In, La, Pb, Os, Se, Si, Sn, Sr, or Va. The nanostructured porous layer may also be an inorganic material based on blends of two or more central elements. Examples of such blends include calcium/titanium blends, sodium/titanium blends, and tin/titanium blends.

In a preferred embodiment, the central element X is titanium (Ti). In particular, nanostructured porous layers made of Titania ($TiO_2$) are of interest. Other oxides, such as tin oxide ($SnO_2$) are also of interest. Titania is an example of an electron-accepting/transporting material. With a band gap of 3.2 eV, Titania ($TiO_2$) absorbs light from the near-ultraviolet region of the spectrum, and the material has relatively high charge mobility. Thus Titania has desirable electronic properties for effective charge-splitting in an active layer of an optoelectronic device. Furthermore, Titania is widely available and relatively inexpensive.

In a particular embodiment, nanostructured layer 100 may be used in the active layer of an optoelectronic device. In such an application, it is desirable for the pores 101 to be filled with a pore-filling material having complementary charge-transfer properties with respect to the compound of central element X. When the pores 101 are filled with a charge-transporting (e.g. electron or hole-accepting) pore-filling material, charges have a path to migrate through the pore-filling material from the overlying layer to the underlying layer and/or vice versa. Examples of suitable hole-accepting pore-filling materials include inorganic materials such as oxides (e.g., CuO), and organic materials such as conjugated polymers and dyes. Of particular interest to embodiments of the present invention are large molecular weight semiconducting organic materials, such as perylenes that are very disc-shaped, dendrimers, spirocompounds, phthalocyanines, (phenylene vinylenes), polyfluorenes and the like. For these materials, the pores desirably have diameter d between about 10 nm and about 50 nm with adjacent pores spaced between about 10 nm and about 50 mm.

Although the nanostructured porous layer 100 has been described as being an electron-accepting/transporting material, it is possible to use a hole-accepting/transporting material, such as CuO instead. An active layer made from a hole-accepting/transporting nanostructured porous layer would use an electron accepting pore-filling material, such as CN—PPV.

Furthermore, the nanostructured porous layer 100 can be used as a sacrificial template for making a device. The nanostructured porous layer 100 may be removed after the pores 101 are filled with the pore filling material leaving behind a nanostructured grid network having structures made of the pore-filling material. The structures can be roughly characterized as having diameter d and neighboring structures are separated by a distance of approximately D measured e.g., by thickness of the pore walls. Empty spaces between the structures can then be filled with a network filling material having complementary charge transfer properties with respect to the pore filling material that forms the structures. In such a case, pores with greater wall thickness D and smaller diameter d may be desirable in order to increase the spacing between the structures.

III. NANOSTRUCTURED LAYER FABRICATION

An active layer for an optoelectronic device of the type described above may be fabricated using surfactant temptation techniques according to a method according to an embodiment of the present invention. Examples of surfactant-templation techniques for producing porous films are described, e.g., by Brinker, et al in U.S. Pat. No. 6,270,846, the disclosures of which are incorporated herein by reference.

FIG. 2 depicts of flow diagram illustrating the method. The method begins at 202 by disposing a precursor sol on a substrate. The precursor sol generally includes one or more covalent metal complexes with a central element X, one or more surfactants, one or more condensation inhibitors, water, and a solvent. The solvent can be a polar organic solvent or any other solvent that solubilizes the other reactants. Examples of suitable solvents include alcohols, (e.g., methanol, ethanol, propanol, butanol, isopropanol), tetrahydrofuran, formamide, dimethylformamide or mixtures thereof. The covalent metal complexes can be metal alkoxides and/or metal halides nitrides etc. For $TiO_2$-based porous surfactant templated films examples of suitable covalent metal complexes include alkoxides such as titanium ethoxide or titanium isopropoxide, titanium chloride, titanium butoxide, titanium (AcAc) (i.e., titanium diisopropoxide(bis-2,4-pentanedionate)), titanium methacryloxyethylacetoacetate triisopropoxide, and titanium bis(triethanolamine) diisopropoxide and the like. For $SiO_2$-based surfactant templated films examples of suitable alkoxides include polysiloxanes such as tetraethylorthosilicate (TEOS).

Examples of suitable surfactants include $HO(CH_2CH_2O)_n(CH_2CHCH_3O)_m(CH_2CH_2O)_nH$, where the subscripts m and n are integers. A particular surfactant of this type is the block copolymer poly(ethyleneoxide)-poly(propyleneoxide)-poly(ethyleneoxide) (EO20-PO70EO20), sometimes known commercially as Pluronic P123. For Pluronic P123, n=20, m=70, n=20 and the nominal molecular weight is 5750 g/mol. Pluronic F127, is a triblock copolymer (PEO-PPO-PEO, having an n-m-n ratio of PEO106PO70EO106, i.e., n=106, m=70, n=106. The nominal molecular weight for Pluronic F127 is 12,600 g/mol. P123 and F127 are difunctional block copolymer surfactants terminating in primary hydroxyl groups. They are nonionic surfactants. Other suitable surfactants include hexadecyl trimethylammonium bromide (CTAB), polyoxyalkylene ether, and poly(oxyethylene) cetyl ether (e.g., Brij56 or Brij58) Pluronic is a registered trademark of BASF Corporation of Ludwigshafen, Germany. Brij is a registered trademark of Atlas Chemicals of Wilmington Del. Brij 56 is polyoxyethylene 10 cetyl ether. Brij 58 has several synonyms, including poly(oxyethylene) cetyl ether, poly(oxyethylene) palmityl ether, polyethylene oxide hexadecyl ether, and polyethylene glycol cetyl ether.

Examples of suitable condensation inhibitors include acids such as hydrochloric acid (HCl), sulfuric acid ($H_2SO_4$), nitric acid ($HNO_3$), carboxylic acids, such as acetic acid (HOAc), and the like, bases such as sodium hydroxide (NaOH), ammonium hydroxide ($NH_4OH$) triethylamine, and the like, and chelating agents, such as ketones, B-diketones, carboxylic acids, B-keto-carboxylic acids, diols, aminoalcohols, crown ethers, hydroxyl or amine containing polymers, small molecules or cosolvents such as ethyl acetoacetate, 2-4-pentadione, acetone, diacetone alcohol, chatecol, stearic acid, lactic acid, chatechol, ethanolamine, triethanolamine and the like.

Generally speaking, the molar ratios of the surfactant, condensation inhibitor, ethanol and water may be in the following ranges with respect to the central element X, where X refers to the central element or inorganic network atom in the covalent metal complex:

[Surfactant]/[X]: a molar ratio ranging from about $1 \times 10^{-7}$ to about 0.1

[Solvent]/[X]: a molar ratio ranging from about 3 to about 50

[Condensation Inhibitor]/[X]: a molar ranging ratio from about $1 \times 10^{-5}$ to about 5

[water]/[X]: a molar ratio ranging from about 0 to about 20.

The sol may be filtered and a thin film prepared from this solution may be disposed on a substrate by spin-coating, web-coating, dip-coating, spray-coating, ink-jet printing, doctor blade coating, spray coating, printing such as screen-printing, ink-jet printing, flexographic printing, gravure printing, micro-gravure printing, and the like. In some embodiments, the substrate may be an electrode. In such a case, the precursor sol may be disposed directly on the surface of the electrode, or the surface of an intervening layer.

Referring again to FIG. 2, at 204 the solvent is evaporated from the precursor sol to form a surfactant-templated film. Evaporation of the solvent causes the formation of surfactant-stabilized microemulsions or micelles that are precursors to a surfactant stabilized film.

The size of one or more pores formed in the surfactant-templated film is controlled at 206 such that the pores have diameters between about 10 nm and about 50 nm with adjacent pores spaced between about 10 nm and about 50 nm measured, e.g., by the thickness of the walls of the pores. For optoelectronic devices, large pores with thin walls tend to allow more light absorption per nm of active layer. The optimum pore size and wall thickness also depends on exciton splitting and charge transport.

Pore diameter and pore spacing in the surfactant templated film may be adjusted by (1) choice of surfactant, (2) concentration of surfactant, (3) the use of block co-polymers, (4) temperature, (5) humidity level, (6) deposition procedure and speed, (7) concentration of covalent metal complex, (8) use of a cosolvent, (9) use of swelling agents, (10) use of chelating agents, (11) use of acids, (12) use of bases, (13) the nature of the covalent metal complex, e.g., in terms of type and nature of ligands attached, or some combination of two or more of (1), (2), (3), (4), (5), (6), (7), (8), (9), (10), (11), (12), and (13). Of particular interest are techniques for controlling the pore diameter and pore spacing based on (2), (3), (7), (9) and (10).

In general, increasing surfactant, increasing solvent, and addition of pore-swelling agents tend to increase pore size. The use of condensation inhibitors that can function as chelators will also tend to increase pore size. Furthermore, a greater alkoxide concentration tends to lead to greater thickness for the walls of the pores and, therefore, greater pore spacing. However, other factors can influence pore spacing.

With respect to (3), surfactant templated thin films having larger pore sizes, e.g., between about 10 nm and about 50 nm may be obtained by using large block co-polymers as surfactants. Generally speaking the larger the surfactant the larger the pore size. For example, where the surfactant is a block co-polymer having a molecular weight greater than about 5000 grams/mole. The upper bound for the molecular weight of the block copolymer depends partly on its solubility in the solvent used in the sol. One possible range of molecular weights is between about 5000 grams/mole and about 15,000 grams per mole. An example is a block co-polymer of the type (EO)106(PO)70(EO)106, with a molecular weight of 12,600. It is also possible to mix two or more different kinds of surfactants in the sol to modulate the pore size.

With respect to (9), swelling agents such as oils can be used to push out the size of the pore during surfactant templation. In general, where the surfactant is hydrophobic on the inside of the pore and hydrophilic on the outside of the pore. The addition of hydrophobic molecules to the precursor sol tends to increase the pore diameter during templation. Examples of suitable hydrophobic molecules include trimethylbenzene (TMB), catechols, polypropylene glycols, tween triton, butanol, hexanol, octanol, octane, isooctane, formamide, and latex. Additionally pores can be enlarged by mixing diblock copolymers, triblock copolymers or one of the preceding hydrophobic or oily molecules with a standard surfactant. Preferably the pore-swelling agent (PSA) is in a molar ratio [PSA]1/[X] of between about 0 and about 5.

In the prior art, pore swelling agents have been used to make materials with larger pores. However, these materials have typically been powders or ceramic materials as opposed to the surfactant templated films or nanostructured porous layers as described herein.

With respect to (10), the use of chelating agents is a preferred technique for controlling pore size or structure or controlling acidity. Chelating agents can be added to the existing sol chelating to the central element X in the sol. Alternatively, the sol can be prepared as a clean chelated-X complex used in the sol. Chelating agents can affect the bonding of the central element X and thereby modulate the pore size during surfactant templation. A chelating agent is a substance whose molecules can form one or more coordinate bonds to a single metal ion. The most common and most widely used chelating agents are those that coordinate to metal ions through oxygen or nitrogen donor atoms, or through both.

Examples of suitable chelating agents include compounds from the family of ketones, B-diketones, carboxylic acids, B-keto-carboxylic acids, diols, aminoalcohols, crown ethers, hydroxyl or amine containing polymers, small molecules or cosolvents such as ethyl acetoacetate, 2-4-pentadione, acetone, diacetone alcohol, chatecol, stearic acid, lactic acid, chatechol, ethanolamine, triethanolamine and the like. Preferably the chelating agent is present in the precursor sol in a molar ratio [Chelating Agent]/[X] of between about 0.1 and about 5, more preferably, between about 1 and about 3.

Note that many of the techniques for controlling pore size and pore spacing involve the preparation of the precursor sol. As such, the acts constituting step 206 may take place, in whole or in part, before during or after evaporating the solvent from the sol at 204 or before, during or after disposing the precursor sol on the substrate at 202. Furthermore, some elements of controlling the pore size may occur contemporaneously with disposing the precursor sol on the substrate, or evaporating the substrate. Such elements include e.g. deposition technique, substrate or sol temperature, rate of evaporation, humidity, etc. The order of the steps in FIG. 2 has been chosen for the sake of clarity and should not be regarded as a limitation on any embodiment of the present invention.

At 208, the surfactant-templated film is covalently crosslinked to form a nanostructured porous layer based on a compound of central element X. As a result of control of the pore size in the surfactant templated porous film at 206, the nanostructured porous layer has pores with diameters between about 10 nm and about 50 nm. Adjacent pores are spaced between about 10 nm and about 50 nm, measured e.g., in terms of the thickness of the pore walls. The crosslinking permanently fixes the surfactant-templated film. The crosslinking may be implemented, e.g., by heating the surfactant templated film. During this step, the surfactant templates can be also be selectively removed, e.g., through exposure to heat. By way of example, heating the as-coated film to between about 170° C. and about 400° C. is typically sufficient to covalently crosslink the mesoporous matrix and/or decompose the surfactant molecules while remaining within the thermal stability range of the underlying substrate.

The incubation temperature, ramp rate and total incubation time may be varied to optimize the properties of the film. The annealing time depends, partly, on the annealing temperature. In general, the high the temperature, the shorter the time and vice versa. However, a particular temperature may be selected to attain a specific crystalline state. An annealing temperature of between about 280° C. and about 450° C., preferably about 350° C. to about 400° C., serves both to covalently cross-link the matrix and to pyrolyze the surfactant out of the matrix within a relatively short time. Once the sol has been cross-linked to itself and the substrate, any remaining surfactant may be removed by heating at a temperature of between about 280° C. and about 450° C. or by soaking the substrate in ethanol or another appropriate solvent. Alternatively, the film may be annealed for a shorter time at a higher temperature or for a longer time at a lower temperature. Furthermore, either as an alternative to annealing, or in conjunction with annealing, the surfactant template may be exposed to energetic radiation, such as ultraviolet (UV) radiation, to facilitate crosslinking of the grid to form a mesoporous grid and to destroy the structure of the surfactant and make it easier to wash out. Nitrogen sorption binding isortherm measurements can be used to measure average pore size of the resulting nanostructured films.

At 210 the pores in the nanostructured porous layer may optionally be filled with a pore-filling material having complementary charge transfer properties with respect to the compound of central element X that makes up the nanostructured porous layer. Of particular interest to embodiments of the present invention are organic pore filling materials such as perylenes, phtalocyanines, merocyanines, terylenes, squaraines, ruthenium complexes, pentacenes, naphthalocyanines, poly(phenylene), polyphenylvinylene, poly(isothianaphthene), polyfluorenes, polyparaphenylene, spirocompounds, poly(squaraine), PEDOT, poly(thiophene), polyacetylene, conjugated C-60, polyaniline, dendrimers, and their derivatives.

Generally, organic pore-filling materials may be provided in the form of a process solution containing a precursor material and a solvent. The process solution may be applied to the nanostructured porous layer by any suitable technique, e.g., web-coating, doctor blade coating, spray coating, spin coating, or a printing such as printing such as screen-printing, ink-jet printing, flexographic printing, gravure printing, micro-gravure printing, and the like. Heat may be applied to the nanostructured porous layer and pore-filling material during this step, e.g., to evaporate solvents and set the pore-filling material and/or to assist material infiltration, e.g., through capillary action and/or osmotic force.

The solvent is desirably one that can solubilize the pore-filling material, effectively wet the nanostructured porous layer material, provide uniform coating, and be processed at the temperatures required for pore infiltration. These parameters, as well as the curing temperature and curing time depend on the nature of the pore-filling material and the solvents used. By way of example a process solution is poly-3-hexylthiophene (P3HT) in THF may be coated on the nanostructured porous layer and cured by heating at about 150° for about 15 minutes.

Alternatively, the pores can be substantially filled by electrochemically growing metal or other inorganic material within the pore channels of the nanostructured porous layer. Such a technique, often referred to as electrodeposition, can be used where the nanostructured porous layer is formed on a conducting substrate, e.g., the base electrode or TCE. A voltage applied between the conducting substrate and another electrode attracts ions from a solution and drives the formation of material within the pores. Larger pores may facilitate electrodeposition of materials such as metals into the pores and provide for a thicker metallic network.

Because a potentially large number of variables can affect the pore size, a combinatorial fabrication and high-throughput screening (HTS) technique can be used to determine best conditions for pore size modulation. For example, multiple parallel changes in the constituents and processing conditions for the precursor sol can be made on a multi-sample plate. In particular, serial dilutions can be carried out on multi-sample plates configured to receive an array of samples, e.g., with different dilutions in each of the X and Y directions. Then the multi-sample plates can be screened for functional and structural changes in the resulting film as a function of the chemical modifications/processing conditions. High-throughput screening techniques are described e.g., in U.S. patent application Ser. No. 10/426,242, to Brian M. Sager et al, filed Apr. 28, 2003 and entitled "COMBINATORIAL FABRICATION AND HIGH-THROUGHPUT SCREENING OF OPTO-ELECTRONIC DEVICES," the disclosures of which are incorporated herein by reference.

Figure 3A:
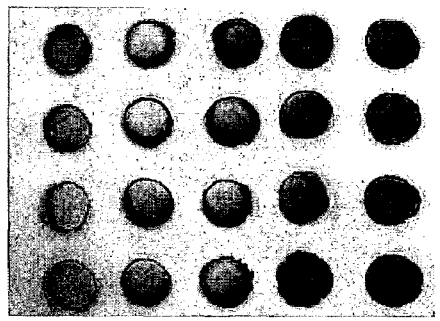
FIG. 3A depicts a functional screening assay for use in high-throughput screening of 20 different nanostructured layers.
Figure 3B:
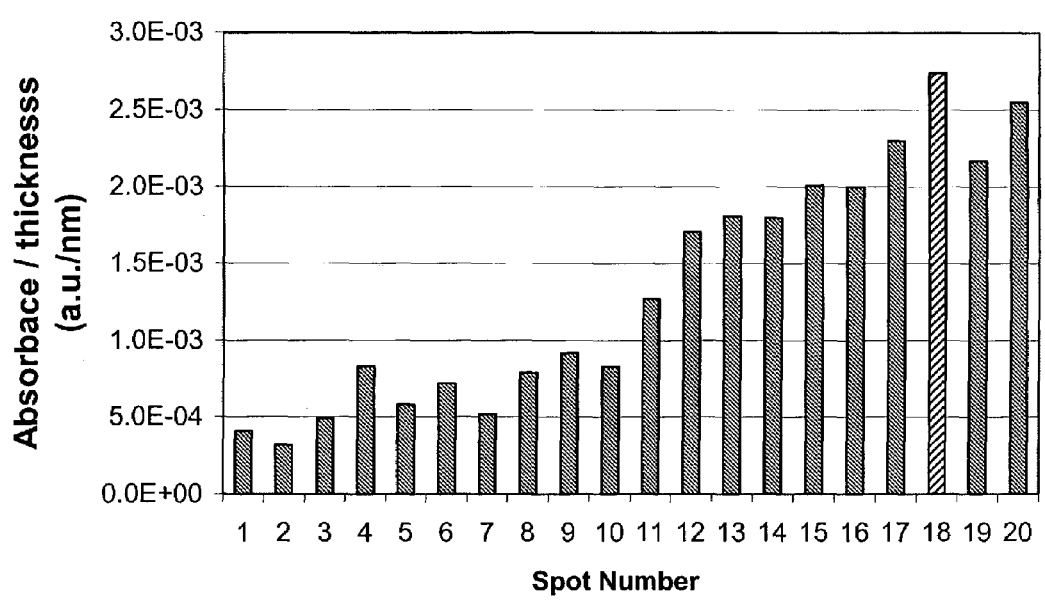
FIG. 3B depicts a bar graph of light absorbance for the nanostructured layers in the functional screening assay of FIG. 3A.

FIGS. 3A-3B illustrate an example of data from a HTS assay. In this example, the screening was based on optical density/absorbance per nm of polymer filled grid showing, e.g. that different structures contain different amounts of polymer (a functional screening assay that can be central to optoelectronic function as well). FIG. 3A depicts a functional assay in the form of a multi-sample plate with 20 different mesoporous grids, each fabricated from a different sol formulation. The grids have been infiltrated with polymer. FIG. 3B is a bar graph showing light absorbance per unit thickness of the grids in FIG. 3A. Formulation # 18 absorbs most light and holds most polymer per nm of thickness. Thus formulation 18 performs best functionally and represents a newly discovered hit in the HTS assay.

IV. EXAMPLES OF NANOSTRUCTURED LAYER FABRICATION

Example 1

Increase Solvent $TiO_2$-based surfactant templated films with roughly 10 nm-20 nm diameter pores can be formed from a precursor sol with increased solvent concentration. In this example, the precursor sol used titanium ethoxide as the alkoxide, Pluronic P123 or F127 as the surfactant, HCl, as the condensation inhibitor, water, and ethanol as the solvent in the following molar ratios:

[Surfactant]/[X]: from about $9 \times 10^{-8}$ to about $1 \times 10^{-2}$
[Solvent]/[X]: from about 10 to about 50
[Condensation Inhibitor]/[X]: from about 0.1 to about 3
[water]/[X]: from about 0.1 to about 10

Example 2

Use of a Pore-Swelling Agent $TiO_2$-based surfactant templated films with roughly 10 nm-30 nm diameter pores can be formed from a precursor sol using trimethyl benzene as a pore-swelling agent (PSA). The precursor sol can use titanium ethoxide as the alkoxide, Pluronic F127 as the surfactant, HCl or HOAc, as the condensation inhibitor, water and ethanol as the solvent in the following molar ratios:

[Surfactant]/[X]: from about $9 \times 10^{-8}$ to about $1 \times 10^{-2}$
[Solvent]/[X]: from about 10 to about 50
[Condensation Inhibitor]/[X]: from about 0.1 to about 3
[water]/[X]: from about 0.1 to about 10
[PSA]/[X]: from about 0.1 to about 3

Example 4

Use of a Chelating Agent $TiO_2$-based surfactant templated films with roughly 20 nm-50 nm diameter pores can be formed from a precursor sol using pre chelated titania or generated in situ using Acetic acid or 2,4-pentanedione as a chelating agent. Acetic acid can also serve as a condensation inhibitor. The precursor sol can use titania diisopropoxide(bis-2,4-pentadioneate) as the alkoxide, Pluronic P123 or others as the surfactant, and ethanol as the solvent in the following molar ratios:

[Surfactant]/[Ti]: from about $9 \times 10^{-8}$ to about $1 \times 10^{-3}$;
[Solvent]/[Ti]: from about 10 to about 50;
[Chelator]/[Ti]: from about 1 to about 3.
[Condensation Inhibitor]/[X]: from 0 to about 5.

III. OPTOELECTRONIC DEVICES USING NANOSTRUCTURED LAYER

According to another embodiment of the present invention, an optoelectronic device includes an active layer sandwiched between two electrodes, at least one of which is at least partially transparent. The active layer is fabricated using a nanostructured porous film having pores between about 20 nm and about 50 nm in diameter.

Figure 4:
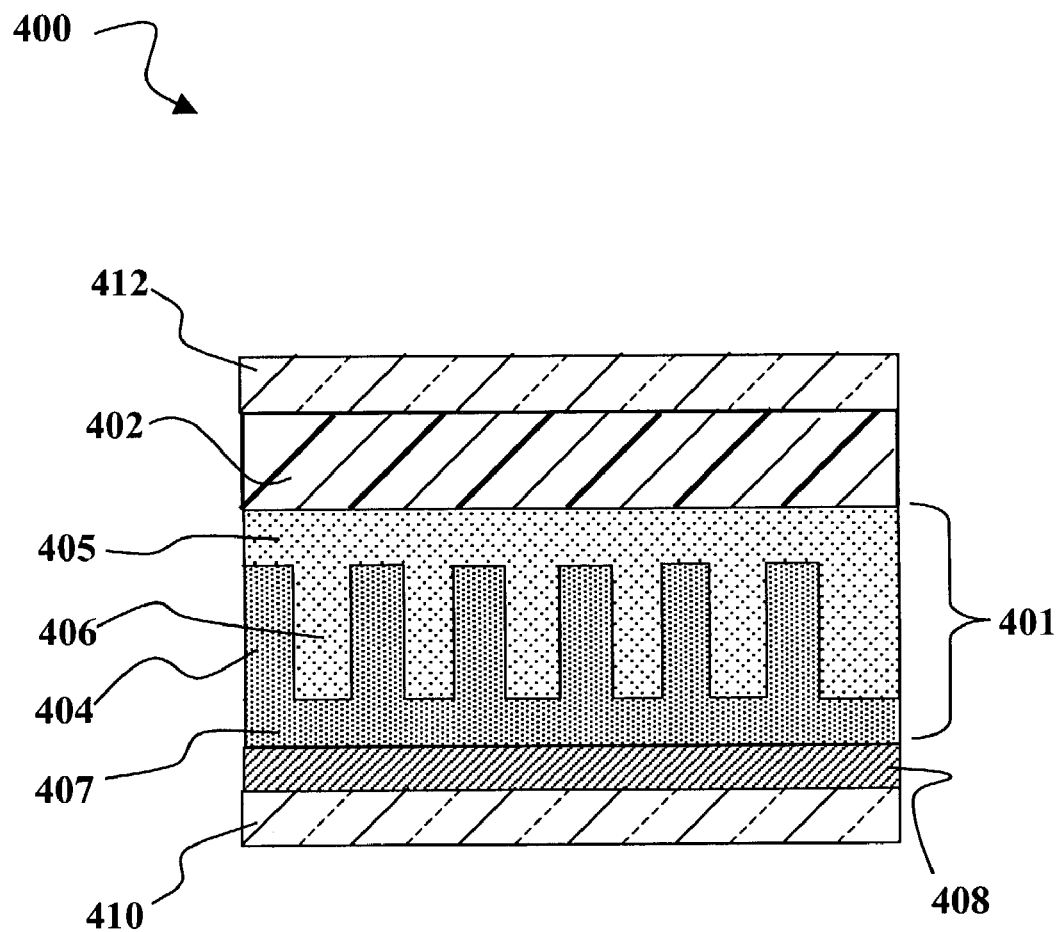
FIG. 4 depicts a cross-sectional schematic diagram of an optoelectronic device according to an embodiment of the present invention.

FIG. 4 depicts an example of a device structure for an optoelectronic device 400 according to an embodiment of the present invention. The optoelectronic device 400 generally includes an active layer 401 disposed between a transparent conducting electrode (TCE) 402 a base electrode 408. The device 400 may be modularized by well-known encapsulation in order to improve weather resistance and mechanical strength e.g., with optional substrate and/or encapsulant layers 410, 412.

The TCE 402 may be a layer of transparent conducting oxide (TCO) such as indium tin oxide (ITO). The TCE 402 may optionally include (either with or without a TCO) some combination of a transparent conducting polymer, a thin metal layer or an array of spaced apart wires, e.g., in the form of a mesh, grid or parallel wires.

The base electrode 408, may be in the form of a commercially available sheet material such as such as C-, Au-, Ag-, Al-, or Cu-coated Steel Foil or metal/alloy-coated plastic foils, including metal or metalized plastic substrates/foils that are planarized to reduce surface roughness. The base electrode 408 may optionally be a TCE. Whether the base electrode 408 is transparent or not depends partly on the nature of the device 400. For example, if the device 400 is a window (e.g., an electrochemical or electrochromic window) both electrodes 402, 410 need to be transparent. On the other hand for radiation emitting devices such as LED's or laser diodes or radiation absorbing devices such as PV cells the base electrode 408 need not be transparent.

In general, the active layer 401 may include a single layer of material or multiple layers. The active layer 401 may generate, absorb, or transmit radiation that passes through the transparent electrode 402. The active layer 401 has a nanostructured porous layer 404 and a pore-filling material 406. The nanostructured porous layer 404 and pore-filling material may have the structure shown and properties described with respect to FIG. 1. In particular, the nanostructured layer has pores with diameter d between about 10 nm and about 50 nm with adjacent pores spaced between about 10 nm and about 50 nm measured, e.g., by wall thickness. By way of example, and with out limitation, the nanostructured porous layer may be between about 50 nm and about 1 micron thick. The pore-filling material 406 substantially fills the pores in the nanostructured porous layer 404. The pore-filling material 406 has complementary charge transfer properties with respect to the nanostructured porous layer 404 as described above with respect to FIG. 1. The active layer 401 may optionally have the nanostructured grid network and network filling material structure described above with respect to FIG. 1.

The active layer 401 may further include an optional first interface layer 405 disposed between the TCE 402 and the pore-filling material 406. The first interface layer 405 may prevent electrical shorts or facilitate charge transfer between the TCE 402 and the nanostructured porous layer 404. The first interface layer 405 may be made from the same material as the pore-filling material 406. The first interface layer 405 may also improve mechanical properties such as flexibility. The active layer 401 may also include a second optional interface layer 407 disposed between the nanostructured porous layer 404 and the base electrode 408. The second interface layer 407 may inhibit electrical shorts between the base electrode 408 and the pore-filling material 406 and/or facilitate charge transfer between them. The second interface layer 407 and the nanostructured porous layer 404 may be made from the same or substantially similar compounds based on central element X.

The optional encapsulants 410, 412 protect the optoelectronic device 400 from the surrounding environment. The encapsulants 410, 412 may also absorb UV-light to protect organic materials disposed between the encapsulants 410, 412. Examples of suitable encapsulant materials include one or more layers of glass or polymers, such as polyethylene terephthalate (PET) and/or Mylar®. Mylar is a registered trademark of E. I. du Pont de Nemours and Company of Wilmington, Del. Either encapsulant layers 410, 412 may include EVA (ethylene vinyl acetate), which has favorable adhesive, weather resistance, and buffer effect properties.

In order to further improve moisture resistance and scratch resistance, a fluorine resin may be laminated to the encapsulant layers 410, 412 as a surface protecting layer. For example, tetra-fluoro ethylene copolymer (TFE, Du Pont TEFLON), copolymer of tetra-fluoroethylene and ethylene (ETFE, Du Pont TEFZEL), polyvinyl fluoride (Du Pont TEDLAR), polychlorofluoroethylene (CTFEC, Daikin Industries Neoflon) are cited. Weather resistance can also be improved by adding a well-known UV absorber. In addition to glass, other inorganic materials, such as ceramics and metal foils may also be used for the encapsulants 410, 412. The encapsulants 410, 412 may also include nitrides, oxides, oxynitrides or other inorganic materials that protect against exposure to water or air. In particular, the encapsulant may be a multi-layer stack or a foil comprising a multi-layer stack of organic materials with inorganic dielectrics.

A device of the type shown in FIG. 4 can be fabricated using the method of FIG. 2 including optional step 210 (filling the pores). Once the pores have been filled, the rest of a device like device 400 may be fabricated in a relatively straightforward fashion. For example, additional process solution may be applied to the surface of the nanostructured layer to cover the filled pores and provide the first interface layer 405. The TCE 402 can then be attached to or deposited on the surface of the active layer 401 (e.g., the exposed surface of the first interface layer 405). The TCE 402, active layer 401 and base electrode 408 can then be laminated between the encapsulants 410, 412.

VI. ALTERNATIVE EMBODIMENTS

In addition to their use in optoelectronic applications (e.g., PV cells, LEDs, flat panel displays, electrochromic devices, electroluminescent devices, and transparent conducting electrodes, e.g. for touch screen panels), nanostructured materials find many other uses. Additional applications for materials containing 10-50 nm pores made through chemical nanostructuring include thin films, coated particles or powders containing nanostructured, self-assembling pores in the size range of 5 nm to 400 nm.

Leveraging their mechanical properties, nanostructured porous layers can be used as a filtration media for liquid, solid, or gaseous carrier media. In this application, specific materials can be filtered out of the carrier media based on size exclusion. These materials include both inorganic and organic chemicals, as well as biological materials including viruses, prions, bacteria, fungi and any of a variety of cells. Applications of such filtration media could include filtering media for environmental control as well as exclusion media for chemical and/or biological purification media such as size-exclusion media for chromatographic processes.

Leveraging their spatially enclosed features, nanostructured porous layers can be used as material storage and delivery devices. Materials to be stored within the pores can vary from hydrogen or other fuels to organic or inorganic chemicals (including pharmaceutical agents such as therapeutics) to biological materials (including proteins). Based on the pore diameter and channel shape, controlled release of the substances can be obtained.

Further leveraging their spatially enclosed features, these nanostructured pores can be used to bring together substrates that participate in a chemical reaction, increasing the rate of that reaction. In this context, the pores serve in a catalytic function. Catalysis could be enhanced simply by bringing together reactants in an enclosed space. Alternatively or additionally, catalysis could be further enhanced by incorporating a substrate or catalyst or other reaction-participating material into the pore walls, including but not limited to inorganic catalysts such as Pt, organic catalysts, and biological molecules including proteins and enzymes, which could be attached in any of a variety of means, either covalently or non-covalently.

Leveraging their optical properties, these nanostructured pores could be used as photonic devices to manipulate light or the path that light takes in any of a variety of optical devices including but not limited to light filters, waveguides, mirrors, beam splitters, and the like.

Leveraging any of a combination of these properties, additional applications include the use of these nanostructured pores in information storage and processing applications, memory storage devices, memory retrieval devices, and the like.

VII. CONCLUSION

Embodiments of the present invention can provide for relatively high volume and low cost production of a wide variety of useful devices. While the above is a complete description of the preferred embodiment of the present invention, it is possible to use various alternatives, modifications and equivalents. It is to be understood that the above description is intended to be illustrative and not restrictive. Many embodiments and variations of the invention will become apparent to those of skill in the art upon review of this disclosure. For example, different process times, reaction temperatures and other reaction conditions may be utilized, as well as a different ordering of certain processing steps. The scope of the invention should, therefore, be determined not with reference to the above description, but instead should be determined with reference to the appended claims along with the full scope of equivalents to which such claims are entitled.

What is claimed is:

1. A nanostructured layer comprising a surfactant-templated titanium dioxide film having a regular array of pores, the pores having diameters between about 20 nm and about 50 nm with adjacent pores spaced between about 10 nm and about 50 nm, wherein the pores are filled with a pore-filling material that has complementary charge-transfer properties relative to the surfactant-templated film.

2. The nanostructured layer of claim 1 wherein the nanostructured layer is formed by:
   disposing a precursor sol on a substrate, wherein the precursor sol includes one or more covalent metal complexes with titanium, one or more surfactants, and a solvent;
   evaporating the solvent from the precursor sol to form the surfactant-templated film;
   controlling the size of one or more pores formed in the surfactant-templated film such that the pores have diameters between about 20 nm and about 50 nm with adjacent pores spaced between about 10 nm and about 50 nm; and
   covalently crosslinking the surfactant-templated film to form a layer of porous material, wherein the film is based on the one or more covalent metal complexes of titanium, the nanostructured porous layer having pores with diameters between about 20 nm and about 50 nm with adjacent pores spaced between about 10 nm and about 50 nm.

3. The nanostructured layer of claim 1 wherein the layer is an absorber layer in an optoelectronic device.

4. The nanostructured layer of claim 1 wherein the surfactant-templated film and the pore-filing material have different electron affinities.

5. The nanostructured layer of claim 1 wherein the surfactant-templated film comprises a covalently crosslinked surfactant-templated film.

6. The nanostructured layer of claim 1 wherein the surfactant-templated film comprises a self-assembled surfactant-templated film.

7. A nanostructured layer, comprising a surfactant-templated titanium dioxide film having a regular array of pores having diameters between about 20 nm and about 50 nm with adjacent pores spaced between about 10 nm and about 50 nm, wherein the pores are filled with a pore-filling material that has complementary charge-transfer properties relative to the surfactant-templated film;
   wherein the pores extend from a bottom surface of the surfactant-templated film to a top surface of the surfactant-templated film.

8. An optoelectronic device, comprising:
   a base electrode;
   a transparent conducting electrode; and
   an active layer disposed between the base electrode and the transparent conducting electrode, having two complementary semiconducting materials, wherein at least one of the two complementary semiconducting materials is present in the active layer in the form of a surfactant templated titanium dioxide film with a regular array of pores having diameters of between about 20 nm and about 50 nm with adjacent pores spaced between about 10 nm and about 50 nm, and the other of the two complementary semiconducting materials is a pore filling material disposed within the pores.

9. The device of claim 8 wherein the array of structures is formed by:
   disposing a precursor sol on a substrate, wherein the precursor sol includes one or more covalent metal complexes with titanium, one or more surfactants, and a solvent;

evaporating the solvent from the precursor sol to form a surfactant-templated film;

controlling the size of one or more pores formed in the surfactant-templated film such that the film has pores with diameters between about 20 nm and about 50 nm with adjacent pores spaced between about 10 nm and about 50 nm;

covalently crosslinking the surfactant-templated film to form a nanostructured porous layer based on titanium dioxide, the nanostructured porous layer having pores with diameters between about 20 nm and about 50 nm with adjacent pores spaced between about 10 nm and about 50 nm; and filling the pores in the nanostructured porous layer with a semiconducting or conducting pore-filling material.

10. The optoelectronic device of claim 9, wherein the size of pores has been controlled by one or more of the following:

adding a chelating agent to the precursor sol, using a solvent/Ti molar ratio of between about 10 and 50 in the precursor sol;

adding a pore-swelling agent to the precursor sol, or using a block co-polymer having a molecular weight between about 5000 and about 14000 grams per mol as the surfactant in the precursor sol.

11. The optoelectronic device of claim 9 wherein the pore-filling material is selected from the group of perylenes, phtalocyanines, merocyanines, terylenes, squaraines, ruthenium complexes, pentacenes, naphthalocyanines, poly(phenylene), polyphenylvinylene, poly(isothianaphthene), polyfluorenes, polyparaphenylene, spirocompounds, poly(squaraine), PEDOT, poly(thiophene), polyacetylene, conjugated C-60, polyaniline, dendrimers, and their derivatives.

12. The optoelectronic device of claim 8 wherein the surfactant-templated film and the pore-filing material have different electron affinities.

13. The device of claim 8 wherein the surfactant-templated film comprises a covalently crosslinked surfactant-templated film.

14. The device of claim 8 wherein the surfactant-templated film comprises a self-assembled surfactant-templated film.

15. The device of claim 8 wherein the pores extend from a bottom surface of the film to a top surface of the film.

16. The device of claim 8 wherein the transparent conducting electrode comprises a transparent conducting oxide.

17. The device of claim 8 wherein the transparent conducting electrode comprises indium tin oxide.

18. The device of claim 8 wherein the transparent conducting electrode comprises a transparent conducting polymer.

19. The device of claim 8 wherein the transparent conducting electrode further includes an array of spaced apart wires.

20. The device of claim 8 wherein the transparent conducting electrode further includes a mesh of wires.

21. The device of claim 8 wherein the transparent conducting electrode further includes a grid of wires.

22. The device of claim 8 wherein the transparent conducting electrode further includes a plurality of parallel wires.

23. The device of claim 8 wherein the base electrode comprises a sheet of C-, Au-, or Ag-coated steel foil.

24. The device of claim 8 wherein the base electrode comprises a sheet of Al- or Cu-coated steel foil.

25. The device of claim 8 wherein the base electrode comprises a metal-coated plastic foil.

26. The device of claim 8 wherein the base electrode comprises a metallized plastic substrate.

* * * * *

UNITED STATES PATENT AND TRADEMARK OFFICE
CERTIFICATE OF CORRECTION

PATENT NO. : 7,645,934 B1 Page 1 of 1
APPLICATION NO. : 10/427749
DATED : January 12, 2010
INVENTOR(S) : Fidanza et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1039 days.

Signed and Sealed this

Twenty-eighth Day of December, 2010

David J. Kappos
*Director of the United States Patent and Trademark Office*